United States Patent [19]

Rogers et al.

[11] Patent Number: 5,456,608
[45] Date of Patent: Oct. 10, 1995

[54] CROSS-CONNECT SYSTEM

[75] Inventors: Wesley D. Rogers, Huntsville, Ala.; Douglas G. Hard, Fayetteville, Tenn.

[73] Assignee: CONX Corporation, Huntsville, Ala.

[21] Appl. No.: 111,770

[22] Filed: Aug. 25, 1993

[51] Int. Cl.$^6$ ............................................. H01R 29/00
[52] U.S. Cl. ............................ 439/48; 29/845; 361/633
[58] Field of Search ................... 439/45–48; 361/633, 361/805; 414/751, 749, 626; 29/739, 842, 845

[56] References Cited

U.S. PATENT DOCUMENTS

| | | |
|---|---|---|
| 516,379 | 3/1894 | Müller . |
| 543,160 | 7/1895 | Shibata . |
| 1,137,271 | 4/1915 | Miner . |
| 1,264,826 | 4/1918 | Lundquist . |
| 1,411,478 | 4/1922 | Budd et al. . |
| 1,523,407 | 1/1925 | Dobbin . |
| 1,681,215 | 8/1928 | Blauvelt . |
| 1,712,393 | 5/1929 | Merk . |
| 1,812,546 | 6/1931 | Nilson et al. . |
| 2,036,305 | 4/1936 | Snyder . |
| 2,092,624 | 9/1937 | Memelsdorff . |
| 2,283,040 | 5/1942 | Brinkmann et al. . |
| 2,301,772 | 11/1942 | Boswau . |
| 2,330,812 | 10/1943 | Deakin . |
| 2,516,772 | 7/1950 | Hickman . |
| 2,624,807 | 1/1953 | Deakin . |
| 2,901,547 | 8/1959 | Miloche . |
| 2,952,828 | 9/1960 | Dorizzi ..................................... 439/48 |
| 3,028,573 | 4/1962 | Stoehr ..................................... 361/805 |
| 3,045,077 | 7/1962 | Knanishu . |
| 3,065,439 | 11/1962 | Krause ..................................... 361/633 |
| 3,171,898 | 3/1965 | Sladek . |
| 3,175,179 | 3/1965 | Trump ..................................... 361/633 |
| 3,179,913 | 4/1965 | Mittler et al. . |
| 3,188,403 | 6/1965 | Semo . |
| 3,208,028 | 9/1965 | Mittler et al. . |
| 3,252,056 | 5/1966 | Poesl . |
| 3,258,730 | 6/1966 | Husband et al. ......................... 439/46 |
| 3,305,644 | 2/1967 | Watanabe . |
| 3,631,374 | 12/1971 | Cartelli . |
| 3,751,594 | 8/1973 | Strother . |
| 3,796,848 | 3/1974 | Southworth, Jr. . |
| 3,969,594 | 7/1976 | DeLuca et al. . |
| 4,124,788 | 11/1978 | Kedian, Jr. . |
| 4,163,135 | 7/1979 | Steen . |
| 4,208,080 | 6/1980 | Teagno . |
| 4,520,234 | 5/1985 | Fields et al. . |
| 4,573,262 | 3/1986 | Dornes et al. ........................... 29/739 |
| 4,817,134 | 3/1989 | Pickens et al. . |
| 4,964,105 | 10/1990 | Schrodt et al. . |
| 5,017,145 | 5/1991 | Kanai et al. ............................. 439/48 |

Primary Examiner—Neil Abrams

[57] ABSTRACT

A switching matrix includes at least two parallel circuit boards each having plural conductive traces and multiple matrix holes therethrough arranged to permit traces on one board to be connected to traces on the second board. Connection is achieved by means of a flexible non-conductive circuit jumper pin having a resilient conductive sleeve arranged to extend between an aligned pair of holes in the two boards. The holes are conductively plated to define female contacts to radially compress the conductive sleeve. Circuit jumper pins may be moved between different matrix positions manually or by a pick and place mechanism controlled from a remote location. In one embodiment, serving as a telephone cross-connect switch, connections are made in pairs, therebeing four circuit boards and two conductive sleeves on each pin, each sleeve interconnecting a pair of traces on a respective pair of boards. In this embodiment the pins are inserted to the first board and external connections to the matrix are made via plug-end connectors at the fourth board. Connections between the first and fourth boards are provided by jumper rods extending through aligned jumper holes defined in each board. Housekeeping holes are provided at the matrix periphery to jump signals between the first and second boards and between the third and fourth boards.

56 Claims, 10 Drawing Sheets

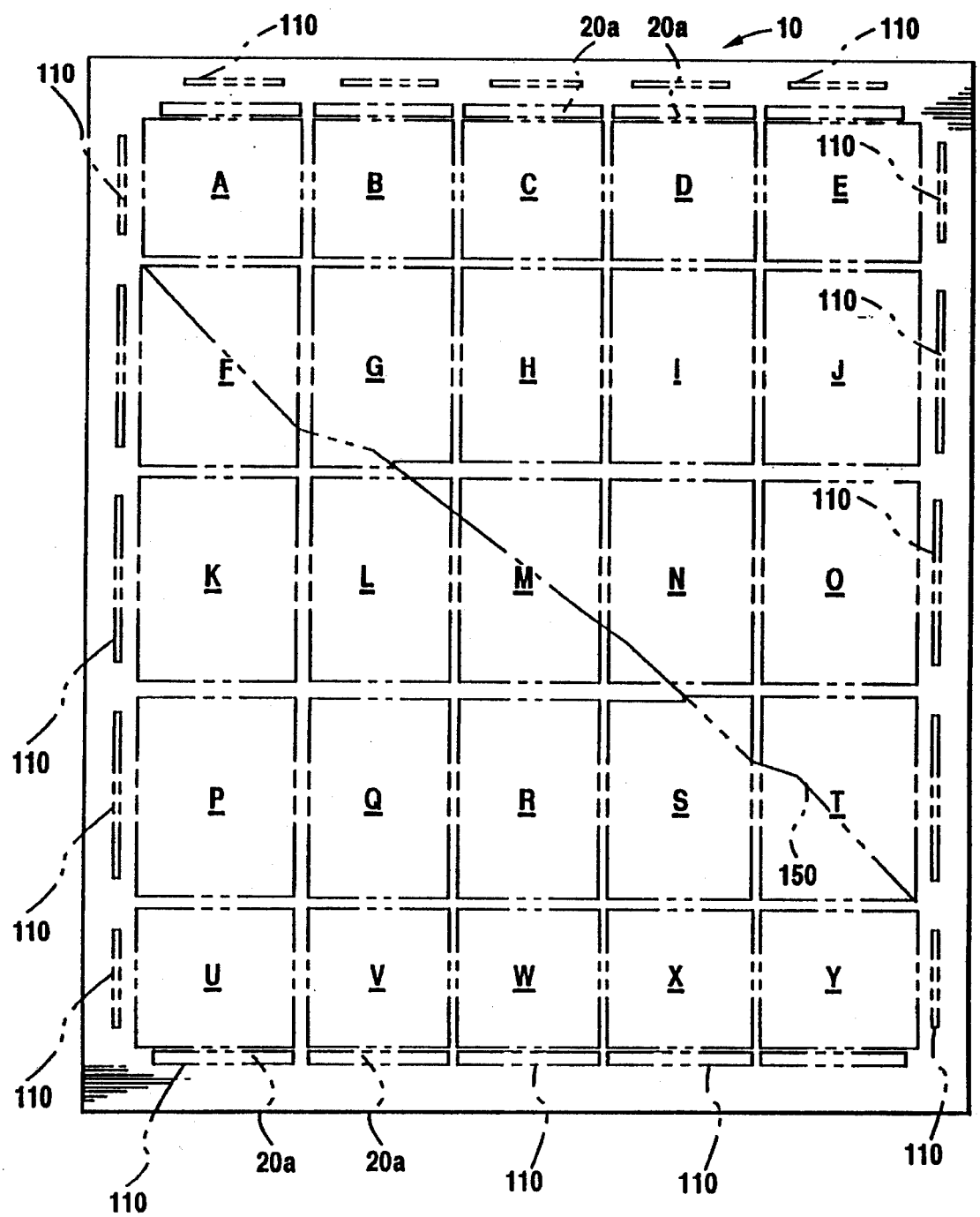
FIG. I

CROSS-CONNECT SYSTEM

TECHNICAL FIELD

The present invention pertains to improvements in matrix switch systems and, more particularly, to a method and apparatus for inexpensively and efficiently providing for selective interconnections between multiple cable pairs from respective telephone subscribers and multiple switch cable pairs at a central telephone office. Although the preferred embodiment takes the form of a cross-connect switching system for telephony, it will be appreciated that the invention has more general applicability, particularly in any switching system wherein matrix-type switches are useful. The invention is ideally suited for systems wherein the matrix switch is advantageously controlled from a remote location.

DISCUSSION OF THE PRIOR ART

Matrix switches for selectively connecting multiple subscribers to multiple system lines can be located at central offices attended by telephone company personnel. However, it is particularly advantageous to be able to dispose such switches at unattended remote locations and effect the necessary connections from the central office. Specifically, there is a current trend in the telephone industry to reduce costs by placing remote digital offices in areas of prospective subscribers, and connecting the remote office to the central office via digital carrier lines. This arrangement permits superior service by limiting the length of lines between subscribers and the localized remote office site. Since the connections between the remote and central offices is via time shared carrier lines, a significant savings in copper is realized, and the distance between the remote and central offices can be virtually unlimited.

In view of the fact that state of the art digital remote stations are extremely reliable, the most common cause for requiring personnel to attend such stations is to change service to subscribers. For example, when a new subscriber requires connection to the system, it is necessary for personnel to visit the remote station site and physically connect the subscriber tip (T) and ring (R) lines to corresponding switch tip and ring lines. Likewise, a subscriber who cancels service must have the subscriber's cable pair physically disconnected from a corresponding switch cable pair. Often this requires service personnel to drive many miles in both directions to effect the service change, thereby resulting in a waste of expensive time.

It is desirable, therefore, for a telephone operating system to have the capability of effecting connections and disconnections at the remote station by means of controls located at the central office.

This problem has been addressed in the prior art; for example, reference is made to U.S. Pat. No. 4,817,134 (Pickens et al). That patent discloses a cross-connect system employing a single circuit board having multiple parallel subscriber traces on one surface and multiple parallel switch traces on the opposite surface oriented perpendicular to the subscriber traces. Holes are defined through the board adjacent each possible connection junction between subscriber and switch traces, and a short conductive strip extends from each subscriber trace through the adjacent hole to the opposite surface where it terminates in spaced relation to the adjacent switch trace. Multiple worm screws are disposed spaced from the aforesaid opposite surfaces of the board in parallel relation to respective pairs of subscriber traces. Each worm screw drives a carrier selectively movable parallel to the board by rotating the worm screw until resilient jumper spring elements on the carrier are positioned to bridge selective pairs of subscriber traces to their respective short conductor segments. Rotation of the screws to achieve desired carrier positioning is effected by a motor selectively movable from screw to screw in response to signals derived ultimately from the central office. The selected screw is rotated, also in response to signals from the central office, to position the carrier at the desired connection location. A microprocessor is provided to effect motor positioning and screw rotation in response to commands from the central office.

In theory, the Pickens et al system solves the problem of remotely controlling connection and disconnection of subscribers to the system. In practice, however, the system has many disadvantages. For one thing, the motor and worm screw arrangement is costly and requires regular maintenance. The requirement to move the motor from screw to screw and then engage the desired screw adds significantly to the cost and complexity of the system. Moreover, the resilient jumper springs attached to the carrier are required to scrape along their respective carrier traces while proceeding to the intended junction points. In so doing the jumpers intermittently establish unintended connections between subscriber and switch lines. More importantly, the jumpers tend to lose some degree of resilience after a few translations along the board. Possibly of greater importance is the difficulty of assuring that the jumper carrier will be accurately positioned in response to the designed number of screw rotations, particularly if the screws are slightly misaligned during assembly or shipment, or after repeated use.

OBJECTS AND SUMMARY OF THE INVENTION

It is an object of the present invention to provide a method and apparatus for reliably and inexpensively permitting remote connection and disconnection of multiple paired subscriber lines to multiple correspondingly paired switch lines in remote office.

In a broader sense, it is an object of the invention to provide a simple electromechanical matrix switching arrangement wherein any one of a first set of multiple electrical lines can be physically and electrically connected at will to any one of a second set of multiple electrical lines.

Another object of the present invention is to provide a reliable method and apparatus for selectively providing jumper connections between conductors on one circuit board and conductors on another closely positioned and parallel circuit board.

It is a further object of the present invention to provide an improved method and apparatus for remotely and selectively connecting multiple telephone subscriber line pairs to, and disconnecting those line pairs from, multiple switch line pairs at a remote unmanned telephone office.

In accordance with the present invention, plural printed circuit boards have respective aligned matrices of through holes, each hole containing a female contact (preferably formed by the hole being plated with electrically conductive material) disposed in contact with a conductive line trace on at least one surface of its board. Connections between boards are made by inserting a non-conductive circuit jumper pin through matrix holes in adjacent boards such that a male contact in the form of a conductive sleeve on the jumper pin extends between and makes electrical contact with two (or more, if desired) aligned female contacts. In the preferred embodiment there are four such boards, two adjacent boards carrying the subscriber ring and switch ring traces, the other two adjacent boards carrying the switch tip and subscriber tip traces. Selective interconnection of a subscriber's two traces to two corresponding switch traces is effected by inserting the flexible circuit jumper pin through four aligned matrix holes in the respective boards. Each pin has two axially spaced sleeves of conductive spring material arranged to resiliently but firmly contact the female contacts in respective adjacent aligned hole pairs. The plural boards are spaced from one another with insulating material configured so as not to impede the insertion of the connector pin through all of the boards. In the preferred embodiment, the insulating material has holes drilled therethrough in registry with the matrix holes in the separated circuit boards.

The circuit jumper pins may be manually inserted into and removed from the aligned matrix holes. However, in the preferred embodiment the pins are inserted and removed by remote control using a frame configured to support a robotic pick and place mechanism as well as the matrix board assembly. The pick and place mechanism is moved by microprocessor-controlled lead screws to select the proper X-Y position for the pin in the matrix plane. A third lead screw moves the mechanism perpendicular to the matrix plane (i.e., in the Z dimension) to insert and remove the pin. In the disclosed embodiment, one pick and place mechanism with its associated lead screws is capable of servicing a four-panel cross-connect matrix accommodating up to one thousand subscriber cable pairs and seven hundred sixty-eight switch cable pairs. The pick and place mechanism senses the presence of a jumper pin and, under microprocessor control, grasps the pin for removal or releases it after insertion. Housekeeping holes are provided in the circuit boards for storing circuit jumper pins not in current interconnection use.

External connections to the matrix are made at the periphery of one of the matrix board surfaces. Jumper holes at the board periphery are predeterminedly coated or not with an electrically conductive layer to contact pins insertable through these holes from an external plug. The plug pins extend only to a depth of two boards. In order to bring lines to the fourth board, permanent jumper rods extend from the remote board where they are soldered to the intended line trace, through uncoated holes in intermediate boards, to the proximal board where the jumper rod is also soldered to a signal trace capable of being contacted by an external plug pin. Circuit jumper pins may be used to connect traces on the second or third board to the proximal board receiving the external connector.

The above and still further objects, features and advantages of the present invention will become apparent upon consideration of the following detailed description of a specific embodiment thereof, particularly when considered in conjunction with the accompanying drawings wherein like reference numerals in the various figures are utilized to designate like components.

BRIEF DESCRIPTION OF THE DRAWINGS

FIG. 1 is a partially diagrammatic top view in plan of a matrix assembly constructed in accordance with the principles of the present invention.

DESCRIPTION OF THE PREFERRED EMBODIMENTS

Figure 1A:
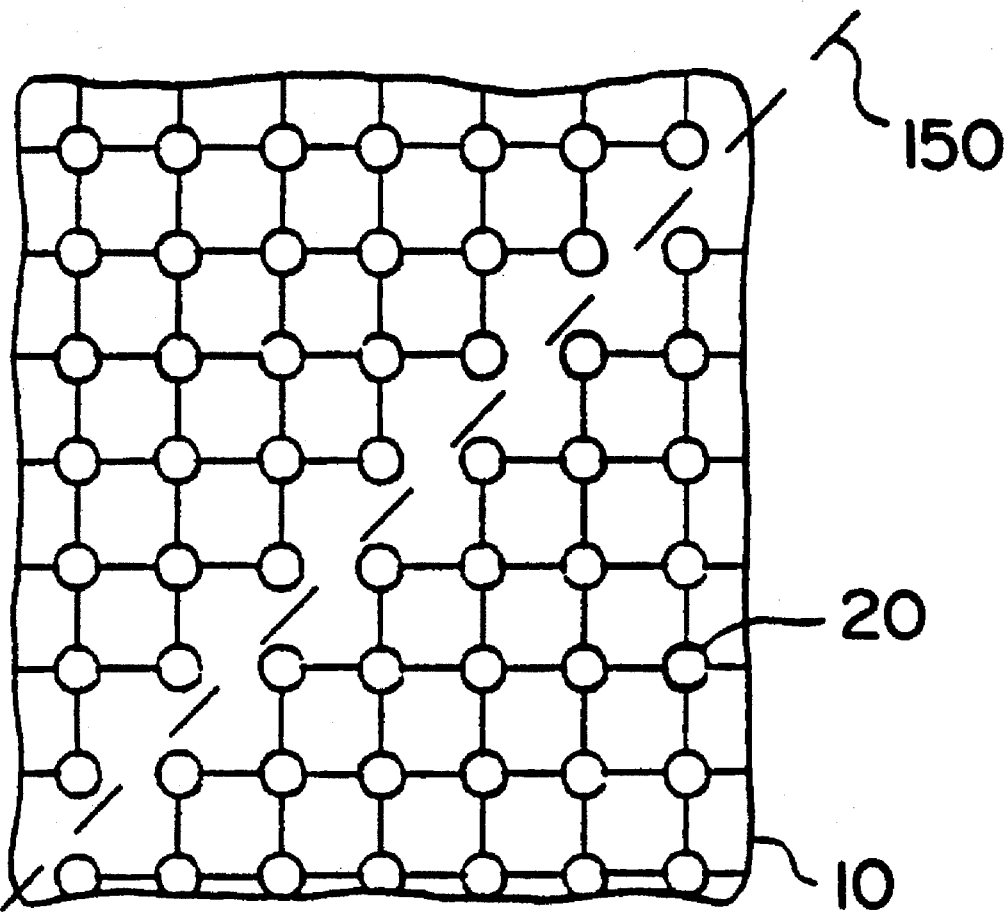
FIG. 1a is a diagrammatic illustration of a portion of the matrix assembly of FIG. 1 showing the division of the matrix into sub-matrices.
Figure 2:
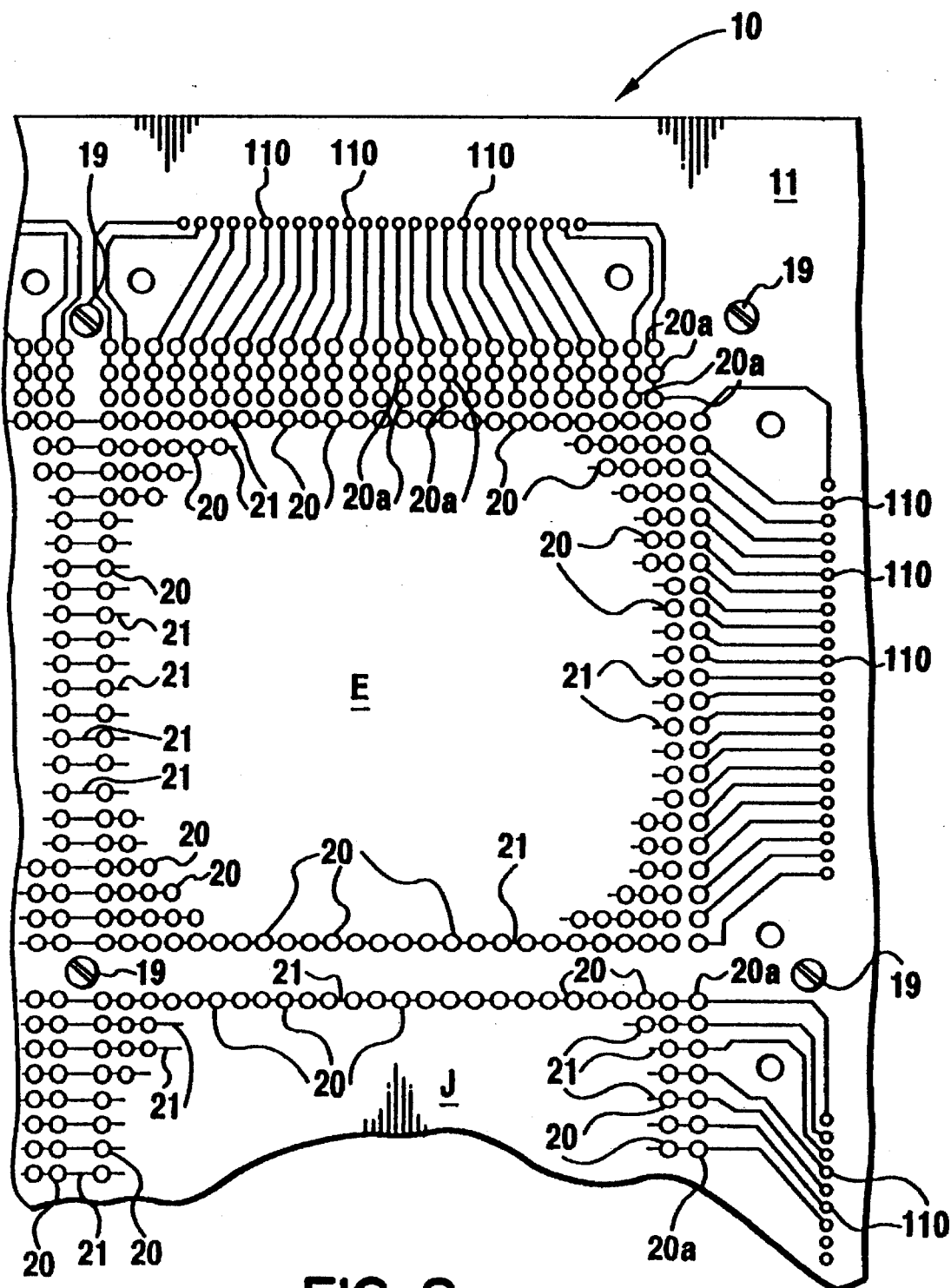
FIG. 2 is an enlarged top view in plan of the upper right corner portion of the matrix assembly of FIG. 1.
Figure 3:
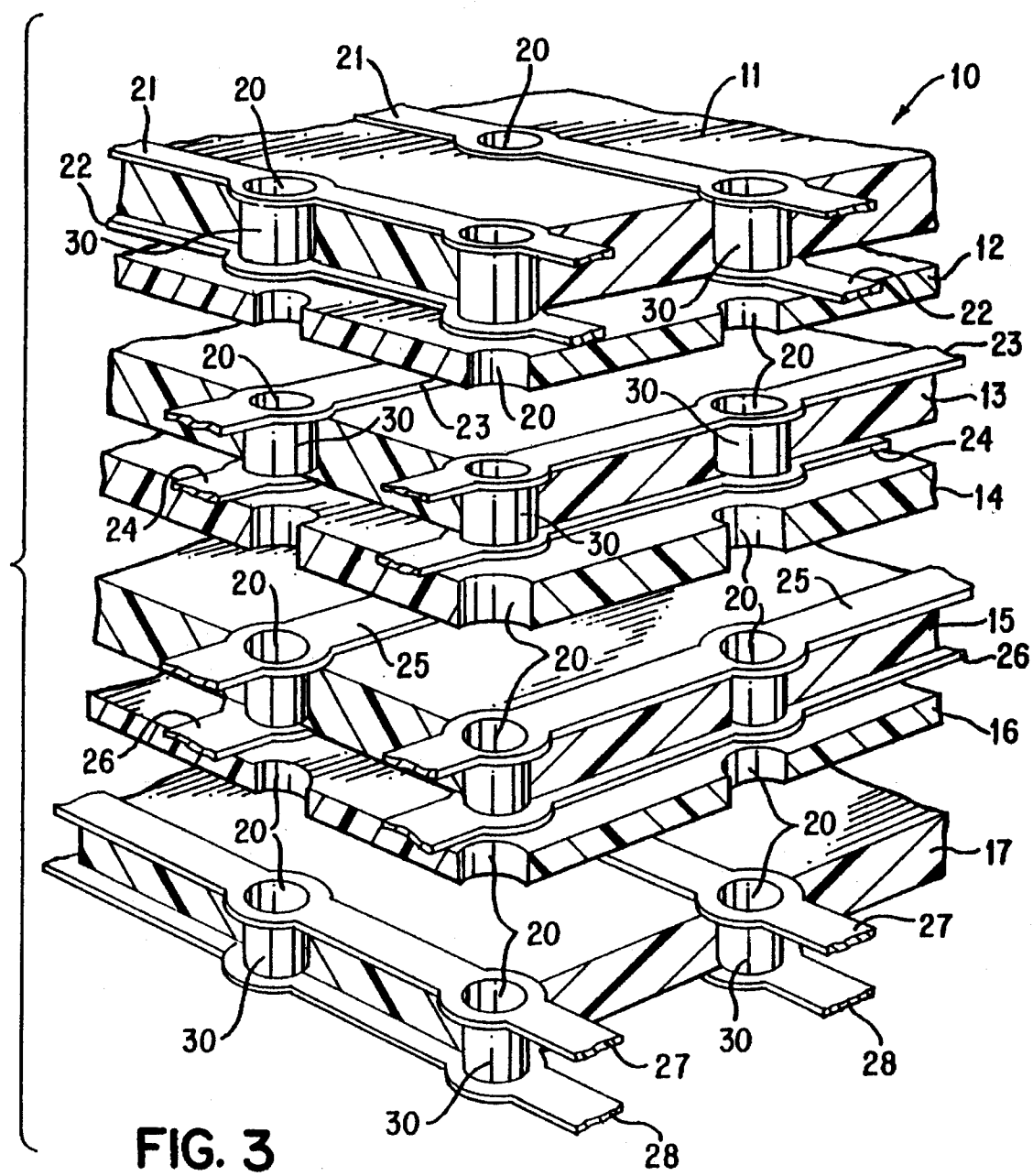
FIG. 3 is an exploded perspective view in section of a portion of the matrix of FIG. 1.

Referring to FIGS. 1–3 of the accompanying drawings, a matrix assembly 10 comprises four stacked planar circuit boards 11, 13, 15 and 17 of generally rectangular configuration. As viewed in FIG. 3, circuit board 11 is the first or top board and is designated herein as the switch tip board. Circuit board 13 is the second board and is designated herein as the subscriber tip board. Circuit board 15 is the next board in sequence and is designated herein as the subscriber ring board. Circuit board 17 is the bottom board and is designated herein as the switch ring board. Designations such as "top" and "bottom" are used for convenience only and are not to be construed as limiting the orientation of matrix assembly 10. An electrically insulative planar board 12 is disposed in abutting relationship between circuit boards 11 and 13 and is substantially coextensive in width and length with those circuit boards. A similar insulative board 14 is disposed between circuit boards 13 and 15, and another insulative board 16 is disposed between circuit boards 15 and 17. These circuit and insulative boards are compressed together by a plurality of rivets, or the like, to provide a compact assembly with each insulative board in abutting contact on each of its surfaces with an adjacent circuit board.

Multiple matrix holes 20 are drilled or otherwise formed through the entire assembly, including all of the seven boards 11 through 17, in a direction perpendicular to the board surfaces. Matrix holes 20 are formed in patterns or groups but, in general form an overall grid-like array. In the particular embodiment illustrated in FIG. 1, there are twenty-five of these patterns designated with respective letters A through Y. Within each of patterns A through Y the matrix holes 20 are arranged in columns and rows. The number of matrix holes in each pattern may be different or the same. Furthermore, while it is conceivable that the patterns can be other than a grid of columns and rows (e.g., a radial pattern, etc.), the grid pattern is particularly advantageous. In this regard, the columns and rows of matrix holes 20 in each pattern are aligned with corresponding columns and rows of adjacent patterns to define one large matrix hole grid made up of all the smaller pattern grids.

On the top (i.e., exposed) surface of switch tip circuit board 11 there are multiple conductive switch tip traces 21 arranged linearly in spaced parallel relation. Switch tip traces 21 are typically plated onto the board surface by known techniques. Each switch tip trace or conductor 21 extends along a respective row of matrix holes 20, whereby each row of matrix holes 20 in circuit board 11 has a respective trace 21. Corresponding switch tip traces 22 are plated onto the underside (i.e., interior) surface of circuit board 11 in precise registry with respective traces 21 on the opposite surface of board 11. Matrix holes 20 extending through the board are conductively plated in a conventional manner to form female contacts 30 (see FIG. 3) interconnecting their respective traces 21 and 22 at each hole 20. In addition to interconnecting traces 21 and 22, female contacts 30 serve to permit interconnections between different circuit boards as described hereinbelow.

The subscriber tip circuit board 13 has multiple subscriber tip traces 23 arranged linearly in parallel spaced relation on its top surface. Identical multiple subscriber tip traces 24 are defined on the bottom surface of board 13 in precise registry with respective traces 23. Plated female contacts 30 are also provided in the matrix holes 20 of board 13. Traces 23 and 24 extend along respective columns of holes 20 and are electrically connected by female contacts 30. Subscriber tip traces 23 and 24 extend orthogonally relative to switch traces 21 and 22 on circuit board 11.

On the subscriber ring circuit board 15 there are subscriber ring traces 25 and 26 disposed at the top and bottom surfaces of the board, respectively, in an array identical to that for traces 23 and 24 of circuit board 13, that is, orthogonally to traces 21 and 22 on circuit board 11. On the switch ring circuit board, opposite surface traces 27 and 28 are arranged parallel to traces 21 and 22. It will be appreciated, therefore, that the switch traces on circuit boards 11 and 17 are parallel to each other but orthogonal to the traces on circuit boards 13 and 15.

Figure 4:
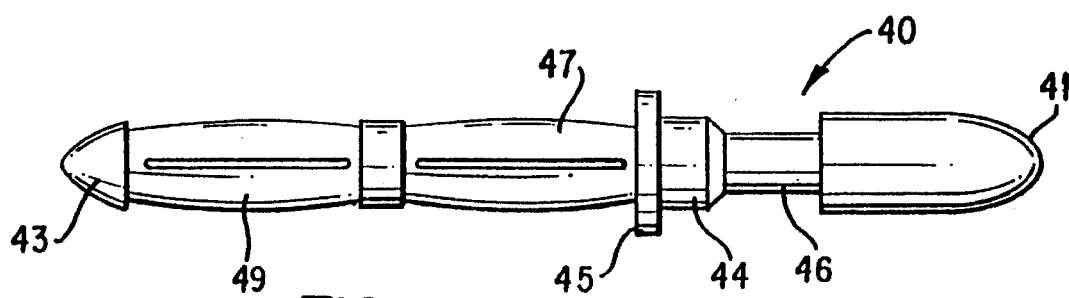
FIG. 4 is a view in elevation of a circuit jumper pin utilized to make connections between traces in the matrix assembly of FIG. 1.

The traces and female contacts 30 on each board are insulated from the traces and female contacts on successive circuit boards by the adjacent insulation boards 12, 14 and 16 interposed between and abutting successive circuit boards. It will be appreciated, however, that any switch tip trace on circuit board 11, for example, can be electrically connected to any subscriber tip trace on circuit board 13 by providing a connection between female contacts 30 of the two circuit boards at the matrix location where the two orthogonally related traces cross. A novel circuit jumper pin 40 for effecting such a connection is illustrated in FIG. 4 to which specific reference is now made.

Circuit jumper pin 40 is an elongated member having a grip 41 at its proximal end and a tapered tip 43 at its distal end. Grip 41 is generally cylindrical with a predetermined diameter and a tapered proximal end. Pin 40 is made of an electrically insulative plastic material that is somewhat flexible in order to preclude breakage when the pin subjected to bending forces or off-axis longitudinal compression but sufficiently rigid to permit the pin to be inserted through a set of aligned matrix holes 20 in matrix assembly 10. In this respect the diameter of pin 40 is smaller than the inner diameter of female contacts 30. An annular stop flange 45 extends radially from pin 40 at a location closer to the proximal end than the distal end of the pin. Proximally of stop 45 the pin has a short cylindrical section 44 with a diameter similar to the diameter of grip 41. Between section 44 and grip 41 there is a reduced diameter cylindrical section 46. Stop flange 45 has a diameter greater than that of holes 20 and divides the pin into insertable and non-insertable length portions. Specifically, the insertable pin portion is located distally of stop flange 45, the depth of insertion into a matrix holes 20 being limited by abutment of flange 45 against the exposed top surface of circuit board 11. The length of the insertable portion of pin 40 is such to permit distal tip 43 to extend through and beyond the bottom circuit board 17 when the pin is fully inserted into the matrix assembly (see FIG. 7).

The portion of pin 40 extending between the female contacts 30 of circuit boards 11 and 13 is surrounded by a tip contact sleeve 47 of electrically conductive spring-like material. A similarly configured ring contact sleeve 49 simultaneously extends between the female contacts 30 of circuit boards 15 and 17. Contact sleeves may take the form, for example, of MC-Multilam LAV bandtype contacts sold by Multi-Contact USA of Santa Rosa, Calif. When unstressed (i.e., radially uncompressed), sleeves 47 and 49 have diameters slightly larger than the inner diameter of female contacts 30. When pin 40 is fully inserted in a set of matrix holes 20, tip sleeve 47 extends between and is radially compressed by aligned female contacts 30 on switch tip board 11 and subscriber tip board 13. This radial compression of the resilient conductive sleeve assures positive electrical contact between the sleeve and the female contacts, thereby assuring connection between the corresponding switch tip trace conductors 21, 22 and the subscriber tip trace conductors 23, 24. Similar connection is made between the subscriber ring trace conductors 25, 26 and the switch ring trace conductors 27, 28 by ring sleeve 49.

It will be appreciated that any switch tip trace 21, 22 can be electrically connected to any subscriber tip trace 23, 24 by simply inserting a pin 40 into the matrix holes 20 corresponding to the crossover location of the traces to be so connected. The ring trace for the same subscriber and the ring trace for the same switch line cross at the same matrix holes 20 so that a complete tip and ring connection between the subscriber and the switch can be made with a single circuit jumper pin 40. Pin 40 can be manually inserted and removed by grasping proximal grip 41 in one's hand and moving the pin axially in the desired direction. The tapered distal end 43 on the pin facilitates insertion. By rendering the pin somewhat flexible, a slight axial misalignment of the pin during insertion will not hinder insertion and, more importantly, will not cause the pin to break due to axial bending forces.

Figure 5:
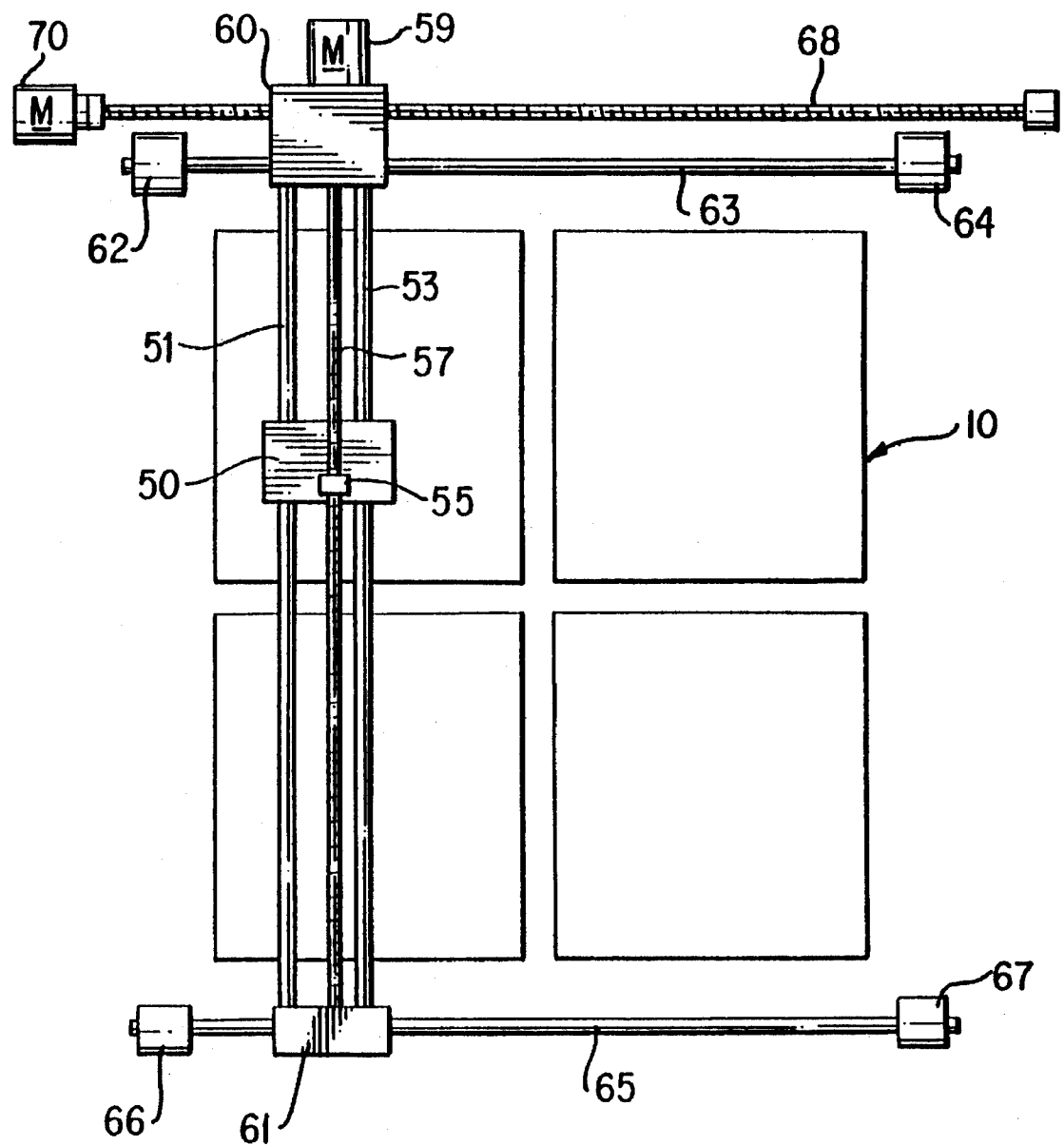
FIG. 5 is a top view in plan of a pick and place mechanism for inserting circuit jumper pins in, and removing circuit jumper pins from, the matrix assembly of FIG. 1.
Figure 6:
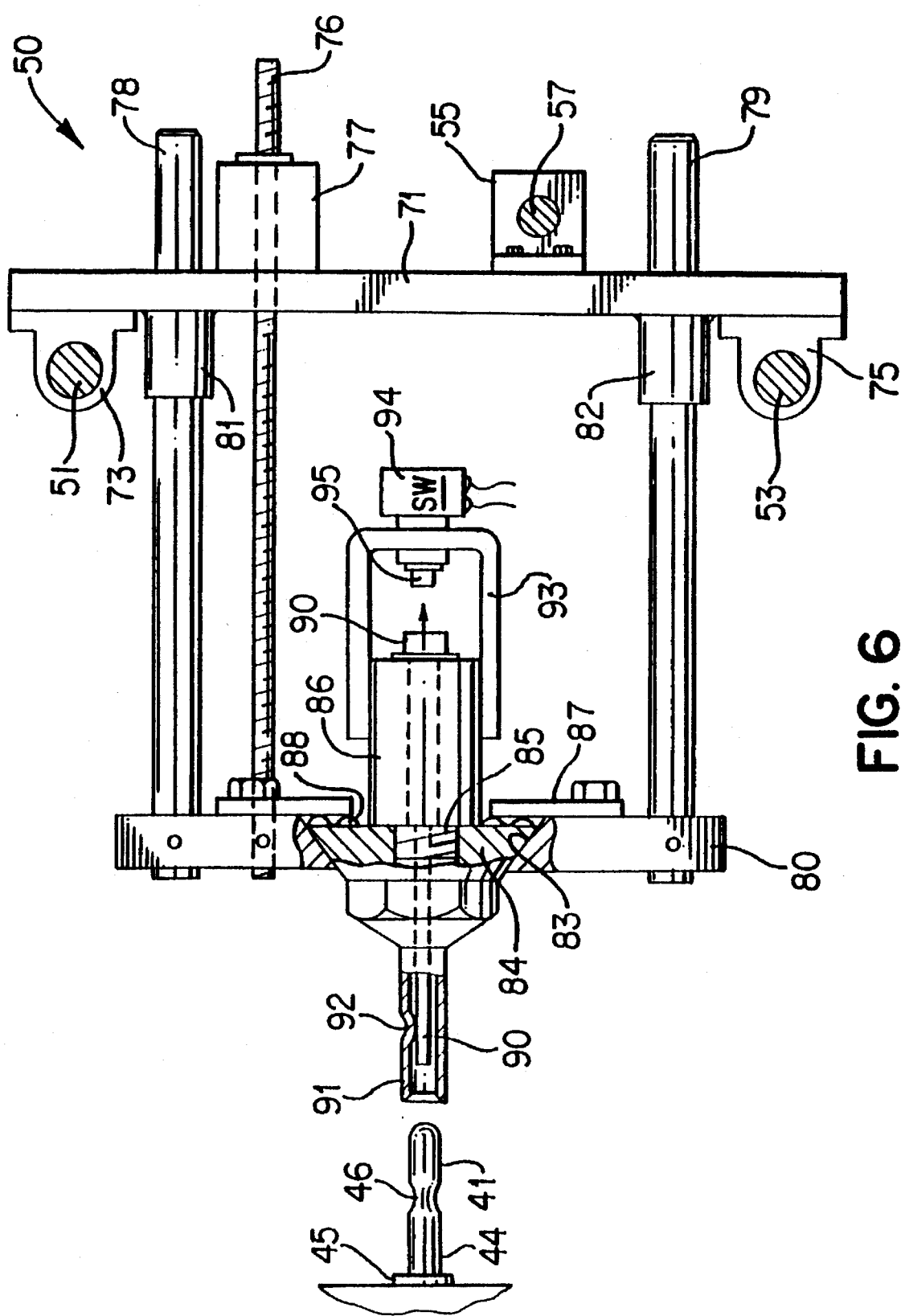
FIG. 6 is a view in elevation and partial section of the pick and place mechanism of FIG. 5.

Of course, the greatest advantage of the structure described above relates to the capability of inserting pins 40 into matrix holes 20 by remote control. A pin picker and placer mechanism capable of being remotely controlled for this purpose is illustrated in FIGS. 5 and 6 to which specific reference is now made. As shown schematically in FIG. 5, a carriage 50 is supported in spaced relation to matrix assembly 10 on a pair of parallel guide rods 51, 53 extending parallel to the Y-axis of the matrix. A threaded receiver 55 on carriage 50 engages a ball screw 57 extending parallel to guide rods 51 and 53. Ball screw 57 is selectively rotatable by a step motor 59 to permit positioning of carriage 50 stepwise along the Y-axis. Motor 59 is mounted on a guide block 60 supporting one end of each guide rod 51 and 53. The other ends of these rods are supported in another guide block 61 disposed at the opposite side of matrix assembly 10. A pair of guide rails 63, 65 extend along the X-axis of matrix 10 on opposite sides of the matrix. Rail 63 is secured at its end to supports 62 and 64; rail 65 is secured at its end to supports 66 and 67. Guide block 60 engages a ball screw 68 and is slidable on guide rail 63. Guide block 61 is slidable on guide rail 65. A step motor 70 selectively rotates ball screw 68 to move guide block 60 along rail 63 to successive locations on the X-axis of the matrix. As a consequence, guide rods 51, 53 are translated perpendicular to their longitudinal axis along with guide block 61, the latter sliding along guide rail 65. It will be appreciated, therefore, that carriage 50 is selectively movable along the matrix X-axis by step motor 70 and along the matrix Y-axis by step motor 59. The spacing between matrix holes 20 corresponds to an integral number of motor steps so that carriage 50 can be controllably positioned at any matrix hole once it has been placed at a known reference position.

As best illustrated in FIG. 6, carriage 50 includes a support plate 71 with spaced sleeves 73, 75 for slidably receiving guide rods 51, 53, respectively. A lead screw 76 extends perpendicularly through support plate 71 to engage a picker platform 80 disposed in parallel spaced relation to the support plate. A lead screw drive motor 77 secured to support plate 71 selectively rotates a nut secured internally of the motor to cause the motor to move along the fastened lead screw to move platform 80 closer to and farther from the support plate. A pair of spaced guide rods 78, 79 are slidable through respective guide sleeves 81, 82 on plate 71 and have their distal ends fixedly secured to platform 80 to facilitate guided movement of the platform relative to the support plate.

Disposed centrally of platform 80 there is defined a frusto-conical through hole 83 having a diameter that decreases in a distal direction. A picker nut 84 has a frusto-conical proximal end, matching the periphery of frusto-conical hole 83, disposed in the hole and threadedly engaging a hollow threaded stud 85 secured to and projecting from the distal end of a solenoid 86. Solenoid 86 is disposed at the proximal surface of platform 80 with its hollow stud 85 projecting perpendicular to platform 80 and into hole 83. An annular retaining washer 87 is secured to the proximal surface of platform 88 to prevent nut 84 from moving axially beyond the proximal surface of platform 80. Retaining washer 87 surrounds the solenoid in coaxial relation with hole 83 and has an inner diameter smaller than the diameter of hole 83 at the platform proximal surface. An annular spring washer 88 is disposed in hole 83 between the proximal surface of nut 84 and the distal surface of retaining washer 87 to permit some degree of resiliency in the assembly as described below.

The armature 90 of solenoid 86 is a rod disposed coaxially in hole 83 and extending through threaded stud 85 into the hollow interior of nut 84. The distal end of nut 84 is configured as a hollow picker tube 91 with a sufficiently large inner diameter to permit free longitudinal movement of armature rod 90 therein. The inner diameter of picker tube 91 is also equal to or just slightly larger than the diameter of grip 41 of circuit jumper pin 40 in order to permit the grip to be longitudinally received in the tube and frictionally engaged therein. A small radial protuberance 92 from the inner wall of picker tube 91 is positioned longitudinally to be received in the recessed section 46 of circuit jumper pin 40 to positively retain the pin in the picker tube and prevent inadvertent disengagement.

A bracket 93 is secured to solenoid 86 and supports an electrical switch 94 having an actuator button 95 axially aligned with the solenoid armature rod 90. Actuator button 95 is positioned to be depressed, thereby actuating the switch, when rod 90 is in its fully retracted position.

In operation, when it is desired to pick a circuit jumper pin 40 from a particular matrix hole 20, carriage 50 is stepped to the X-Y location of that hole by step motors 59 and 70. Accordingly, once carriage 50 has reached the desired X-Y location, lead screw drive motor 77 is energized to axially move the lead screw 76 and move platform 80 toward the matrix assembly. At this time solenoid 86 is not actuated so that armature rod 90 is freely movable within picker tube 91. Since there is no proximally directed force applied to rod 90, the rod cannot depress actuator button 95 to actuate switch 94. As the open distal end of picking tube 91 reaches pin 40, grip portion 41 of the pin enters the tube, gradually pushing rod 90 in a proximal direction. Maximum insertion of pin 40 into tube 91 corresponds to protuberance 92 extending radially into the recessed diameter section 46 of the pin. In this position of the pin, rod 90 is forced by the pin against actuator button 95 to actuate switch 94, thereby signifying that the pin is engaged. Lead screw motor 77 is then operated in the reverse direction to move platform 80 and the engaged pin 40 away from matrix 10. This movement continues until the engaged pin is retracted to a location where it will not interfere with other inserted pins once carriage 50 begins to move. Thereafter, the carriage is moved by motors 59 and 70 to a matrix hole location where the engaged pin is to be placed. Once carriage 50 and the engaged pin 40 reach the selected location, motor 77 rotates to move along lead screw 76 to again move platform 80 toward the matrix assembly. This movement continues until the engaged pin is inserted into the matrix hole at the carriage location. Stop flange 45 on the engaged pin limits axial movement of the pin through the aligned holes 20. Once this limit is reached, solenoid 86 is energized and applies a distally directed force to armature rod 90 which, in turn, transmits this force axially to the engaged pin. Rod 90 cannot move, however, because stop flange 45 prevents distal movement of the engaged pin. Lead screw motor 77 may then be actuated in the reverse direction to move platform 80 and picker tube 91 away from matrix 10. As the picker tube begins to move, the distally directed force applied to pin 40 through rod 90 by the energized solenoid becomes capable of disengaging the pin from protuberance 92 and forcing the pin out of picker tube 90. The disengaged pin thus remains in the matrix holes in which it has been placed. Distal movement of pin 40 relative to tube 91 permits rod 90 to move distally, thereby removing the actuating force from actuator button 95 of switch 94. It will be appreciated, therefore, that switch 94 is only actuated when a pin 40 is positively engaged in picking tube 91. The information that a pin is presently engaged is useful in the automatic process of pin picking and placement in order to permit appropriate sequential operation of the motors and solenoids.

During a pin picking operation, if the picking tube 91 is slightly off axial center relative to the pin 40 to be picked, the proximal end of the pin impinges against the distal annular edge of the tube. The tapered proximal end of impinging pin grip 45 assists in assuring that the pin is properly guided into tube 91 as the tube continues to move toward matrix 10. In addition, resilient slack in tube 91 is created by spring washer 88. In particular, if the proximal end of grip 45 is urged against the annular edge of tube 91, a torque is applied to the tube and to nut 84 against the resilient bias of spring washer 88. This torque tends to rotate tube 91 off axis in a direction that urges the tube axis closer to the axis of pin 40. The result is to further facilitate entry of the pin into the distally moving picker tube 91. Once the torque is removed (i.e., the pin has been engaged and removed form matrix), spring washer 88 acts to re-center nut 84 and its picker tube 91. When an engaged pin is in the process of being moved axially toward a matrix hole 20 for placement therein, it is possible that the distal end of the pin may be slightly off center relative to the receiving hole 20. The tapered distal tip 43 of pin 40 acts to facilitate entry of the pin into the intended matrix hole. In addition, the resilient slack afforded by spring washer 88 permits off-axis tilting of the picker tube and the engaged pin to further facilitate pin placement. Again, automatic re-centering of nut 84 and tube 91 is effected by the spring washer after the pin has been released. It will be appreciated that other arrangements for effecting automatic re-centering can be employed within the scope of this invention. In this regard, the solenoid mounting arrangement need not include a frusto-conical nut and spring washer arrangement; rather any mounting structure capable of automatically re-centering the solenoid mounting may be used.

Figure 7:
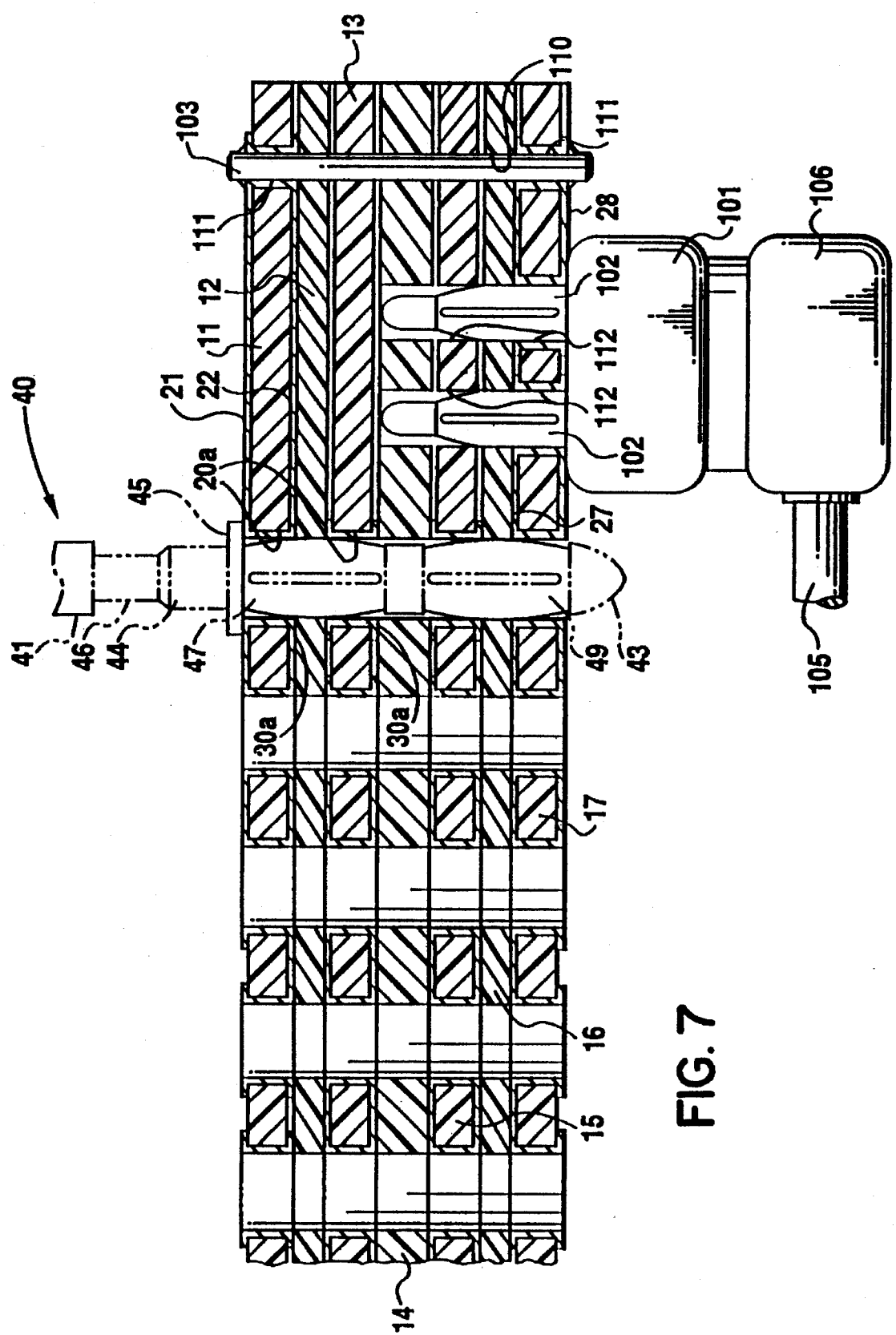
FIG. 7 is a sectional view in elevation of a portion of the matrix assembly of FIG. 1 illustrating the manner in which the circuit jumper pin, permanent Jumper rods, and external connector pins engage various traces on the matrix circuit boards.
Figure 8:
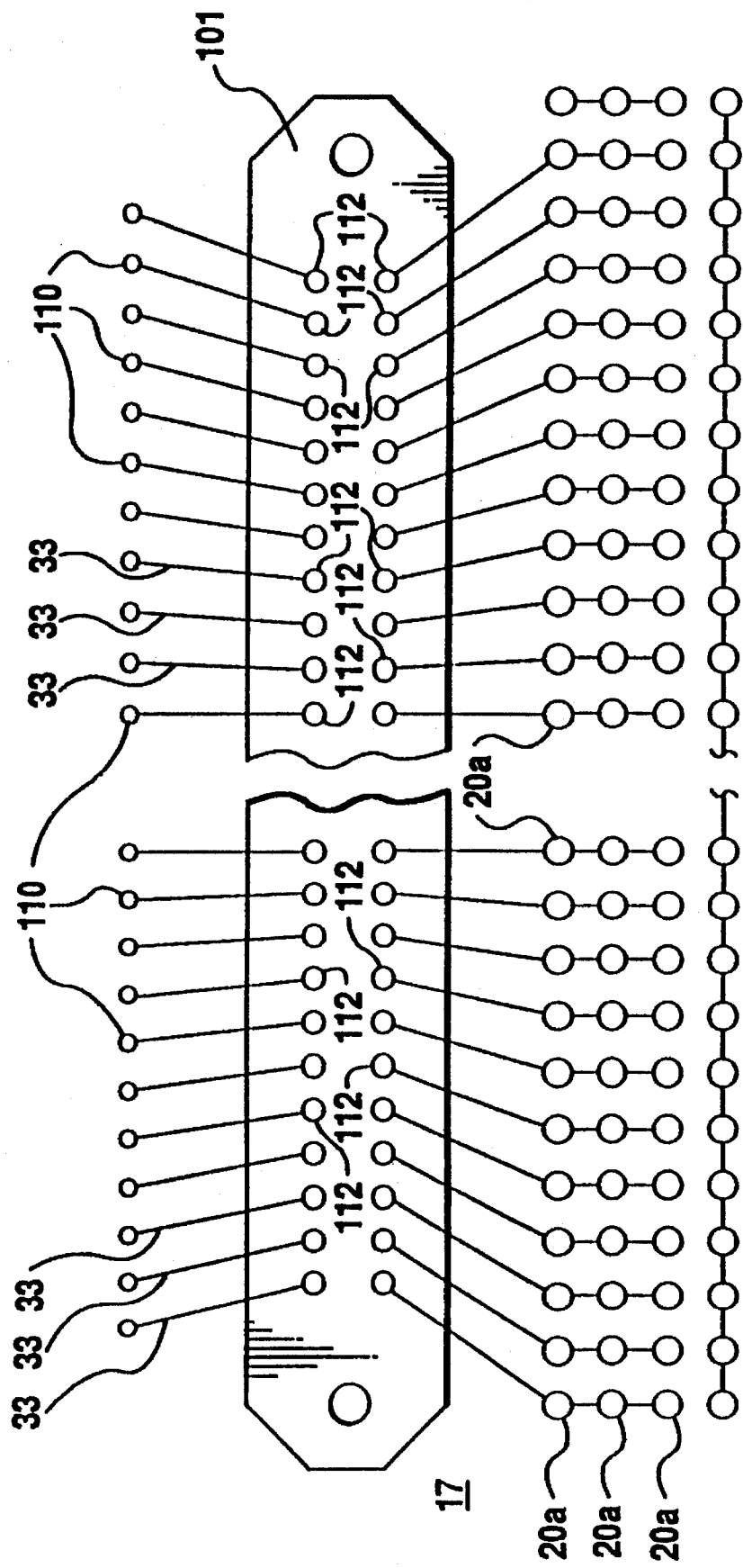
FIG. 8 is an electrical schematic diagram of a portion of the matrix of FIG. 1 illustrating the manner in which external connectors engage traces on the various circuit boards.
Figure 9:
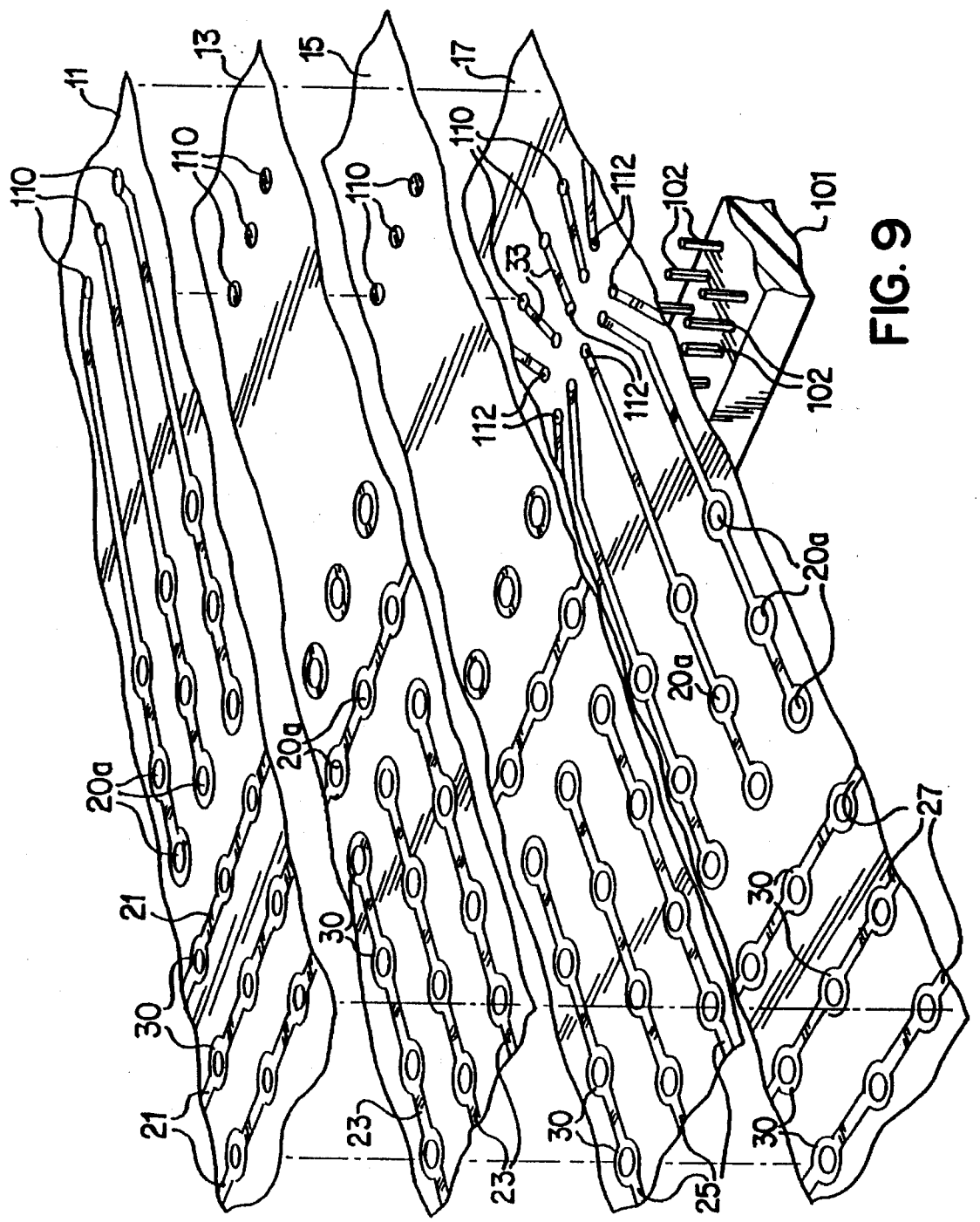
FIG. 9 is a partially diagrammatic view in perspective of a portion of the four circuit board layers in the matrix of FIG. 1, illustrating the manner in which external connections are made to the circuit boards.

External connections to matrix assembly 10 are made at the exposed surface of the switch ring board 17 in a manner illustrated in FIGS. 7, 8 and 9. In particular, a plurality of multiple pin circuit board connectors 101 (only one connector being illustrated in FIGS. 7 and 9 for purposes of preserving clarity) are plugged into plated connector holes 112 provided at the exposed surface of switch ring circuit board 17 about the periphery of the matrix holes. This is the opposite surface of the matrix assembly from the surface at which the jumper pins 40 are inserted into the matrix holes 20. Circuit board connectors 101 may be the type sold as Action Pin connectors by AMP, Inc. of Harrisburg, Pa. Each connector 101 has two parallel rows of connector pins 102, an inboard row closer to the adjacent matrix pattern and an outboard row closer to the periphery of board 17. The inboard connector pins 102 serve to connect traces on circuit board 17 to an external cable 105 via a cable termination connector 106 plugged into the circuit board connector 101. In order to provide external connection to and from the other circuit boards 11, 13 and 15, a variety of different techniques may be employed. In the illustrated embodiment, the preferred technique for bringing traces 21, 22 from circuit board 11 to a board connector 101 is to first extend the corresponding trace 21, 22 to a corresponding housekeeping plating hole 20a located near the periphery of board 11. For example, referring to FIG. 1 and particularly to matrix pattern J, traces 21, 22 extend to a single column of housekeeping holes 20a disposed along the right side of the pattern. These holes, in turn, are connected by conductive traces to respective jumper holes 110 in a parallel column of jumper holes extending along the adjacent board periphery. An electrically conductive jumper rod 103 (FIG. 7) is employed to jump traces from the switch tip board 11 to the switch ring board 17 and ultimately into contact with respective pins 102 of one of the connectors 101. For this purpose there are multiple sets of jumper holes 110 defined through each of boards 11 through 17 adjacent the board peripheries. These jumper holes are typically of smaller diameter than matrix holes 20 and are best illustrated in FIGS. 1, 2, 7 and 9. The jumper holes 110 in the various boards are aligned to provide respective jumper channels extending depthwise through the entire depth or thickness of matrix assembly 10. There is one such jumper channel for each matrix subscriber tip and switch tip conductor trace. In order to jump a conductor trace from board 11 to board 17, for example, the corresponding jumper hole 110 on board 11 is conductively plated at 111 (FIG. 7) so as to interconnect the two juxtaposed traces on opposite surfaces of board 11. The aligned jumper hole 110 on board 17 is similarly conductively plated at 111 to join respective traces on opposite surfaces of that board. A jumper rod 103 is inserted through the channel comprised of the aligned jumper holes 110, and is soldered at its ends to the plating 111 in the holes on boards 11 and 17. Jumper rod 103 thus brings the selected trace from board 11 to board 17 where rod 103 contacts a respective trace 33 via the plating 111 in the jumper hole in board 17. Trace 33 extends to one hole 112 of an outer row of plated connector holes 112 on board 17 where the trace contacts an outboard pin 102 of connector 101 for external connections of the signal.

It is noted that there are two rows of connector pin receiving holes 112 for each connector 101, namely an outer row disposed closer to and adjacent a row of jumper holes 110, and an inner row disposed closer to the matrix holes 20. These rows correspond to and receive respective outboard and inboard rows of pins 102 of connector 101. The holes 112 in the outer row are all connected by traces 33 on both surfaces of board 17 to respective jumper holes 110. Holes 112 in the inner row are connected to respective housekeeping holes 20a disposed on board 17 in three rows located between the connector pin holes 112 and the matrix holes 20.

In order to provide external connections for traces 23, 24 on circuit board 13, the trace must be connected to an available housekeeping hole 20a on circuit board 11. To accomplish this, a circuit jumper pin 40 is employed. In particular, and referring to FIG. 7, a subscriber tip trace 23, 24 (shown going into the plane of the FIG. 7 drawing) is brought to one of the housekeeping holes 20a of a row of such holes 20a extending along an edge of the matrix on board 13. The housekeeping holes 20a are identical to matrix holes 20 in size and shape and are plated with female contacts 30a similar to female contacts 30. When a circuit jumper pin 40 is disposed in a housekeeping hole 20a, the proximal conductive sleeve 47 of the circuit jumper pin 40 connects the female contact 30a of board 13 to an aligned female contact 30a of board 11, thereby permitting the external subscriber tip signal to be jumped between these boards. From board 11 the external subscriber tip signal is brought to a jumper hole 110 on board 17 and to an outer connector pin hole 112 in the same manner described above for bringing an external switch tip signal from board 11 to board 17 (i.e., by means of a dedicated jumper rod 103).

Subscriber ring signals on board 15 can be brought to board 17 for external connection in either of two ways. In one approach the connector pins 102 from connector 101 make direct contact with a plated connector pin hole 112 in board 15. The preferred approach, however, is to permit the distal conductive sleeve 49 of a circuit jumper pin 40 to jump the signal between boards 15 and 17 at aligned housekeeping holes 20a. In either case, the aligned connector pin through holes 112, some of which are plated as required to contact connector pins 102, permit external connection via connector 101. Pins 112 are arranged in two rows positioned, as best illustrated in FIG. 8, to receive the two rows of pins 102 of connectors 101. Each hole 112 in the outer row is connected by a circuit board trace 33 to a respective jumper pin 110 on board 17 to permit the tip signals from boards 11 and 13 to be connected to the corresponding row of connector pins 102. The holes 112 in the inner row are connected to corresponding housekeeping holes 20a on board 17 to permit connection of ring signals from boards 15 and 17 to the corresponding inboard row of connector pins 102. The switch ring traces on board 17 can be brought directly to respective housekeeping holes along board 17 to provide access to an inner connector hole 112 on that board.

Figure 10:
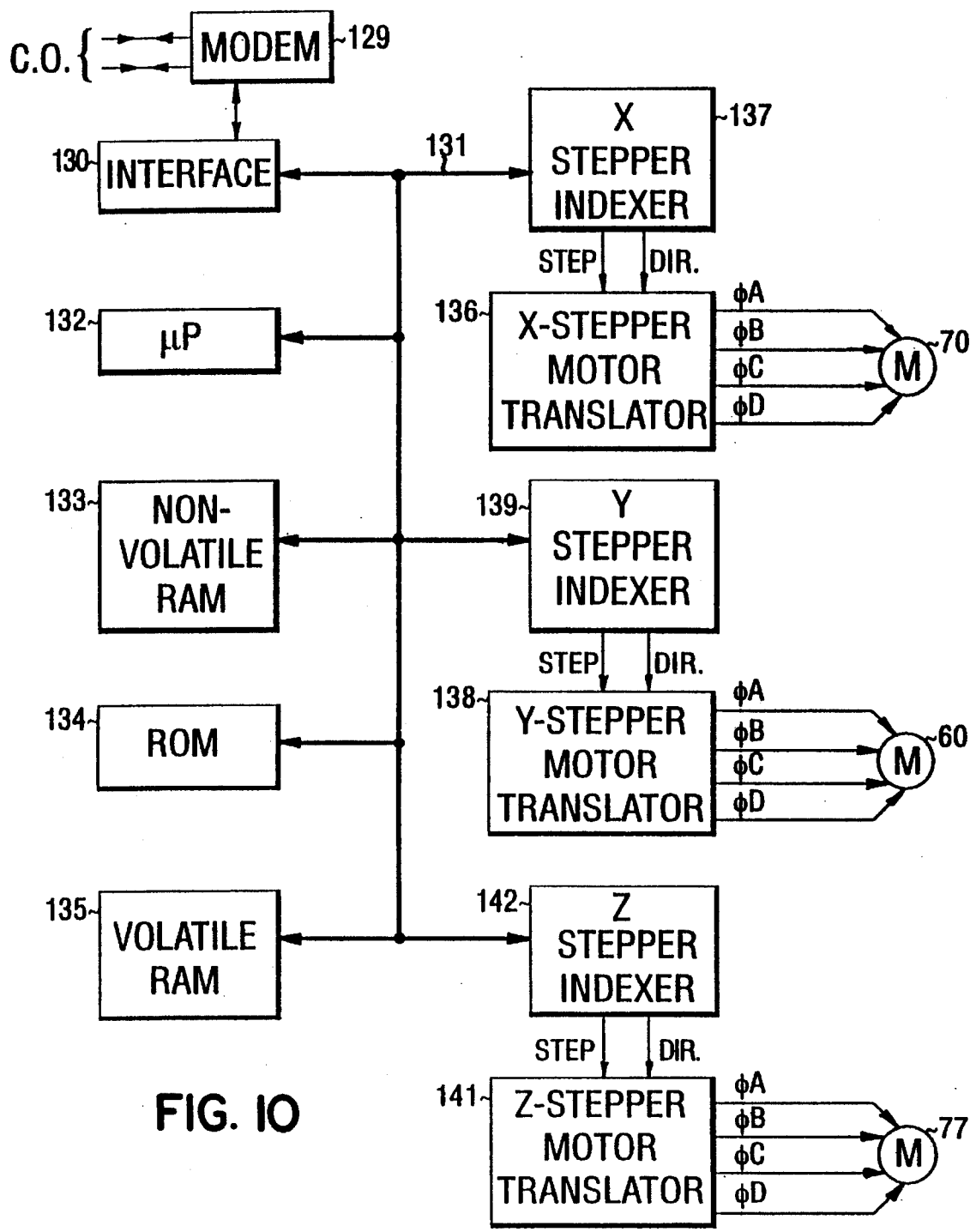
FIG. 10 is an electrical block diagram of the system for controlling the pick and place mechanism of FIG. 6.

As noted above, it is possible to manually place a circuit jumper pin 40 into a particular set of aligned matrix holes 20 to connect the tip and ring signal lines of the corresponding subscriber to respective selected signal switch tip and switch ring signal lines for connection to the local switch and then via a digital carrier line to a central office. The most advantageous use of the present invention, however, is to place pins 40 in matrix holes 20 with the picker and placer mechanism (FIGS. 5 and 6) controlled remotely from the central office. A generalized block diagram of equipment located at the remote station and permitting such remote control is provided in FIG. 10 to which specific reference is now made.

Control signals from a telephone system central office are received by a modem 129 having an interface 130 arranged to format the signals and distribute them via a microprocessor bus 131 to a microprocessor 132. Bus 131 provides signal communication between the microprocessor and all of the controlled equipment and data processing circuits at the remote station. Microprocessor 132 controls operation of the equipment at the remote station, including X-axis step motor 70, Y-axis step motor 60 and Z-axis step motor 77. A non-volatile read/write random access memory (RAM) 133 is provided to store the status (i.e., whether or not occupied) of the various matrix locations, the housekeeping hole locations and the circuit jumper pins 40. A read only memory (ROM) 134 stores the operating system program and application program to operate the microprocessor. A volatile RAM 135 serves the function of transient working storage.

The X-axis step motor 70 is controlled by an X-stepper motor translator 136 which in turn is controlled by a X-stepper indexer 137. Translator 136 and indexer 137 are commercially available components used in a conventional manner to control stepping motors. Translator 136, for example, may be a model NEAT SDM7, manufactured by New England Affiliated Technologies, while indexer 137 may be a model INDEXER LPT (using line printer controller) manufactured by Ability Systems Corporation. In response to control signals received from microprocessor 132 via bus 131, X-stepper indexer 137 applies step and direction signals to the x-stepper translator 136. The translator responds by applying appropriate phase control signals to motor 70 to positionally step guide block 60 (FIG. 5) horizontally (i.e., in the X-direction).

Y-axis step motor 59 is controlled by a Y-stepper translator 138 and Y-stepper indexer 139 which are substantially the same as translator 136 and indexer 137, respectively, to positionally step guide block 50 (FIG. 5) vertically (i.e., in the Y-direction). Likewise, step motor 77 is controlled by a similar Z-stepper motor translator 141 and Z-stepper indexer 142 to positionally step platform 80 (FIG. 6) in the Z-direction.

For purposes of simplicity and to facilitate understanding of the invention, the embodiment illustrated and described above shows only one pick and place mechanism. In practice, it is more efficient to subdivide the matrix into two or more sub-matrices or sections, whereby two or more carriages 50 are employed to exclusively serve respective matrix sections. This would permit quicker access to pins 40 and matrix holes 20 since the carriages would have shorter distances to travel. As an example of such a subdivision, reference is made to FIGS. 1 and 1a wherein a substantially diagonal line 150 subdivides the matrix into two electrically isolated sections sub-matrices. For such an arrangement, signal traces on the various boards would not extend past line 150 so that each half of the matrix exclusively serves as a sub-matrix for its own set of subscriber and switch lines.

It is possible, with the disclosed embodiment, to connect a subscriber pair (i.e., tip and ring traces) from one matrix assembly 10 to a switch pair on another matrix assembly. For example, the situation may arise where there is no unused switch pair available on one matrix assembly for a subscriber pair on that assembly requiring connection to a switch pair. Under such circumstances the subscriber pair can be connected externally of its matrix assembly, in the manner described above (i.e., via a connector 101, etc.), to the assembly containing the unused switch pair. In this regard, one or more matrix sections of the matrix assembly may be reserved for providing the necessary connection points to permit connections between the assemblies.

Although in the disclosed preferred embodiment of the invention the connections made by the circuit jumper pins 40 are between orthogonally related traces on two successive circuit boards, the traces to be connected can be other than orthogonally related (i.e., at any angle, parallel, radial traces on one board connected to circular traces on another board, etc.). The important feature is that the matrix holes 20 be provided through the traces and the sandwiched boards at the proposed interconnection points to permit the radially flexible electrically conductive sleeve of a non-conductive longitudinally flexible pin to interconnect the traces on the two boards.

It will be appreciated that, although the preferred embodiment disclosed herein provides for each circuit jumper pin 40 to make two separate connections, the pins and boards can be arranged to provide for any number of connections made by an inserted pin. For example, if only two circuit boards are used, only one connection is made; if six circuit boards are used, three connections are made; if 2x circuit boards are used, x connections are made. Each connection between a pair of circuit boards requires a respective conductive sleeve to be appropriately positioned along the circuit jumper pin. It will also be appreciated that more than two conductors can be connected together using the principles of the present invention. For example, if it is desired to selectively interconnect three (or more) conductors on three circuit boards via aligned matrix holes, it is only necessary to extend the length of the conductive sleeve on the circuit jumper pins to permit the sleeve to extend between three or more circuit boards.

It is preferred that the female contacts 30 in the matrix holes 20 be plated with gold over nickel to provide a durable, low electrical resistance connection having high resistance to corrosion. Of course, any conductive hole-plating technique may be employed. Contact sleeves 47, 49 are preferably made of hardened spring material, such as beryllium-copper, and are also preferably coated with gold over nickel. The non-conductive body of pin 40 is made of any suitable molded plastic material, with Delrin being the preferred material.

Matrix holes 20 and pins 40 have been disclosed as having peripheries encompassing circular areas; however, other peripheral configurations may be employed within the purview of the invention. By way of example, elliptical or polygonal peripheries are possible, certainly for systems wherein the pins are manually inserted into the matrix holes. For remotely controlled pin positioning, certain peripheral configurations may require apparatus for assuring proper angular orientation of the pin before it is inserted into a hole. It is also within the scope of the invention to provide female contacts 30 in a configuration other than completely surrounding the matrix holes; that is, a female contact may be plated only over a portion of the periphery or only over a portion of the axial length of the matrix hole.

One aspect of the invention involves utilization of plural carefully registered circuit boards having plated through holes serving as the passive member in each selected cross-connection made by the active member (i.e., the circuit jumper pin). Typically, the matrix assembly is formed by drilling the matrix holes in all of the boards simultaneously to assure hole registration. After drilling, the holes are plated on each individual circuit board, and then all of the boards are laminated together with insulative boards interposed between the circuit boards. In the disclosed embodiment, the resulting structure forms two matrices, one for the tip signals and the other for the ring signals.

In the preferred embodiment, matrix holes 20 have diameters of 0.078 inches and have their centers spaced by 0.140 inches. The spacing between circuit boards 11 and 13, and between circuit boards 15 and 17 is 0.031 inches. The axial length of contact sleeves 47, 49 when unstressed is 0.190 inches; the outside diameter of those sleeves when unstressed is 0.085 inches. The length of the portion of the body of pin 40 from flange 45 to the remote end of distal tip 43 is 0.460 inches. Flange 45 has a diameter of 0.130 inches and an axial length of 0.050 inches.

From the foregoing it will be appreciated that the invention makes available a novel method and apparatus for efficiently and inexpensively making connections between two or more circuits, either manually or, most advantageously, automatically. The primary intended utilization of the invention is to provide an automated means for connecting telephone lines in a telephone central office to cable pairs going to subscriber locations. The invention can be utilized in any application requiring an easily configurable matrix cross-connect arrangement that is both inexpensive and reliable.

Having described preferred embodiments of a new and improved cross-connect system in accordance with the present invention, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An interconnection matrix system comprising:

a first circuit board having a first surface with a first array of multiple electrical conductors thereon, said first circuit board having multiple matrix holes defined therethrough and through said electrical conductors at predetermined locations along said conductors in said first array;

a second circuit board having a first surface with a second array of multiple electrical conductors thereon, said second circuit board having multiple matrix holes defined therethrough and through said electrical conductors in said second array at predetermined locations along said conductors in said second array, wherein the matrix holes in said first circuit board are concentrically aligned with corresponding matrix holes in said second circuit board; and a plurality of circuit jumper pins each having an elongated body made from electrically non-conductive material and having a first electrically conductive sleeve disposed about a portion of said pin body, each pin configured to be inserted through and received by aligned receiving matrix holes on said first and second boards with said sleeve in electrical contact with and extending between the receiving matrix holes to provide an electrical connection between one electrical conductor on said first circuit board and one electrical conductor on said second circuit board;

wherein said pin body includes a tapered distal end, a proximal grip portion, and a radially extending stop flange disposed between said distal end and said grip portion and proximally of said conductive sleeve, said stop flange having at least one transverse dimension larger than said matrix holes to limit pin insertion and define a fully inserted position of said pins into said matrix holes;

a third circuit board having a first surface with a third array of multiple electrical conductors thereon, said third circuit board having multiple matrix holes defined therethrough and through the electrical conductors in said third array at predetermined locations along said third array, wherein the matrix holes in said first and second circuit boards are concentrically aligned with corresponding matrix holes in said third circuit board;

a fourth circuit board having a first surface with a fourth array of multiple electrical conductors thereon, said fourth circuit board having multiple matrix holes defined therethrough and through the electrical conductors in said fourth array at predetermined locations along said fourth array, wherein the matrix holes in said first, second and third circuits boards are concentrically aligned with corresponding matrix holes in said fourth circuit board;

a second conductive sleeve disposed about a portion of said body of each of said circuit jumper pins at a location distally of said first sleeve;

wherein each circuit jumper pin is configured such that when a pin is fully inserted through concentrically aligned matrix holes in said first, second, third and fourth circuit boards such that said first sleeve contacts electrical conductors on said first and second boards, said second sleeve extends between and is in electrical contact with one electrical conductor on said third circuit board and one electrical conductor on said fourth circuit;

wherein said sleeves are resiliently compressible radially and are radially compressed when disposed within a matrix hole;

wherein each of said matrix holes has a respective electrically conductive female contact secured therein in electrical contact with the electrical conductor through which said matrix hole is defined, said female contact being sized and configured to positively contact and radially compress a contact sleeve on one of said circuit jumper pins extending through said each matrix hole;

and wherein each of said first, second, third and fourth circuit boards has a second surface opposite its first surface, the second surface of each board having an additional array of electrical conductors thereon substantially identical to and juxtaposed with the array on said first surface of said each board, wherein said matrix holes extend through the electrical conductors on the additional arrays, and wherein each of said female contacts electrically contact respective electrical conductors on the first and second surfaces of each board.

2. The system of claim 1 wherein said female contacts are annular electrically conductive platings covering the peripheries of said matrix holes and extending onto the first and second circuit board surfaces to electrically contact said respective electrical conductors.

3. The system of claim 2 further comprising:

a first electrically insulative board disposed between said first and second circuit boards in abutting contact with the second surface of said first circuit board and the first surface of said second circuit board;

a second electrically insulative board disposed between said second and third circuit boards in abutting contact with the second surface of said second circuit board and the first surface of said third circuit board; and a third electrically insulative board disposed between said third and fourth circuit boards in abutting contact with the second surface of said third circuit board and the first surface of said fourth circuit board;

wherein each of said insulative boards has multiple matrix holes defined therethrough in concentric alignment with corresponding matrix holes in said first, second, third and fourth circuit boards.

4. The system of claim 3 wherein the multiple electrical conductors in each of said first, second, third and fourth arrays are parallel linear conductors;

wherein the parallel linear conductors in said first array extend orthogonally to the parallel linear conductors in said second array; and wherein the parallel linear conductors in said third array extend orthogonally to the parallel linear conductors in said fourth array.

5. The system of claim 4 wherein each of said linear conductors in said first array is parallel to and juxtaposed with a respective linear conductor in said fourth array, and wherein each of said linear conductors in said second array is parallel to and juxtaposed with a respective linear conductor in said third array.

6. The system of claim 5 wherein each conductor in said first array is connected to a respective switch tip line in a telephone exchange;

wherein each conductor in said fourth array is connected to a respective switch ring line in said telephone exchange;

wherein each conductor in said second array is connected to a respective subscriber tip line in said telephone exchange; and wherein each conductor in said third array is connected to a respective subscriber ring line in said telephone exchange.

7. The system of claim 1 wherein each of said circuit jumper pins, when fully inserted in aligned matrix holes in said first, second, third and fourth circuit boards, has said stop flange abutting an exposed surface of said first circuit board and has said distal tip disposed adjacent said fourth circuit board, said system further comprising:

multiple connector pin holes defined in said fourth circuit board for receiving respective connector pins to provide for external connection to the conductors on each circuit board;

plural jumper holes defined through each of said first, second, third and fourth circuit boards, each jumper hole in each circuit board being concentrically aligned with a respective set of jumper holes in the other circuit boards;

a plurality of conductive traces on said first circuit board each extending between a respective jumper hole on the first circuit board and a conductor in said first array;

a plurality of conductor traces on said fourth circuit board each connecting a respective jumper hole on said fourth circuit board and a respective connector pin hole on said fourth circuit board; and a plurality of electrically conductive jumper rods inserted through a respective plurality of sets of aligned jumper holes, each said jumper rod being electrically connected to a respective one of said plurality of conductive traces at a jumper hole on said first circuit board and to a respective one of said plurality of conductor traces at a jumper hole on said fourth circuit board without connection to any conductors on said second and third circuit boards.

8. The system of claim 7 further comprising:

a plurality of housekeeping holes defined in said first and second circuit boards, said housekeeping holes being configured substantially similar to said matrix holes, the housekeeping holes in said first circuit board being concentrically aligned with respective housekeeping holes in said second circuit board;

a plurality of conductive female contacts disposed in said plurality of housekeeping holes, respectively;

a plurality of signal transfer traces on said second circuit board connecting respective conductors on said circuit board to respective female contacts in respective housekeeping holes on said second circuit board;

a plurality of transfer traces on said first circuit board each extending between a respective housekeeping hole and a respective jumper hole on said first circuit board;

means for selectively connecting a female contact of a housekeeping hole on said first circuit board to a female contact of a housekeeping hole on said second circuit board; and a jumper rod connecting said respective jumper hole on said first circuit board to a respective aligned jumper hole on said fourth circuit board, said respective aligned jumper hole being connected to a respective jumper pin hole by one of said conductor traces on said fourth circuit board.

9. The system of claim 8 wherein said means comprises one of said circuit jumper pins.

10. The system of claim 1 further comprising pick and place means responsive to commands initiated at a remote location for removing a selected circuit jumper pin from a plurality of aligned holes at one location in said matrix and inserting the selected circuit jumper pin into different aligned holes at another location of said matrix.

11. An interconnection matrix system comprising:

a first circuit board having a first surface with a first array of multiple electrical conductors thereon, said first circuit board having multiple matrix holes defined therethrough and through said electrical conductors at predetermined locations along said conductors in said first array;

a second circuit board having a first surface with a second array of multiple electrical conductors thereon, said second circuit board having multiple matrix holes defined therethrough and through said electrical conductors in said second array at predetermined locations along said conductors in said second array, wherein the matrix holes in said first circuit board are concentrically aligned with corresponding matrix holes in said second circuit board; and a plurality of circuit jumper pins each having an elongated body made from electrically non-conductive material and having a first electrically conductive sleeve disposed about a portion of said pin body, each pin configured to be inserted through and received by aligned receiving matrix holes on said first and second boards with said sleeve in electrical contact with and extending between the receiving matrix holes to provide an electrical connection between one electrical conductor on said first circuit board and one electrical conductor on said second circuit board;

wherein each of said matrix holes has a respective electrically conductive female contact secured therein in electrical contact with the electrical conductor through which said matrix hole is defined, said female contact being sized and configured to positively contact and radially compress a contact sleeve on one of said circuit jumper pins extending through said each matrix hole; and wherein each of said first and second circuit boards has a second surface opposite its first surface, the second surface of each board having an additional array of electrical conductors thereon substantially identically to and juxtaposed with the array on said first surface of each board, wherein said matrix holes extend through the electrical conductors on the additional arrays, and wherein each of said female contacts contact respective electrical conductors on the first and second surfaces of each board.

12. The system of claim 11 wherein said female contacts are annular electrical conductive platings covering the peripheries of said matrix holes.

13. The system of claim 12 further comprising:

an electrically insulative board disposed between said first and second circuit boards in abutting contact with said second surface of said first board and said first surface of said second board.

14. The system of claim 13 wherein the multiple electrical conductors in each of said first and second arrays are parallel linear conductors; and wherein the parallel linear conductors in said first array extend orthogonally to the parallel linear conductors in said second array.

15. The system of claim 11 further comprising pick and place means responsive to commands initiated at a remote location for removing a selected circuit jumper pin from a plurality of aligned holes at one location in said matrix and inserting the selected circuit jumper pin into different aligned holes at another location of said matrix.

16. A method for selective interconnection between selected first and second electrical conductors comprising the steps of:

(a) disposing first and second arrays of conductors on respective first and second spaced parallel surfaces of a first structure to define a matrix such that each conductor in said first array perpendicularly intersects a plurality of longitudinal axes extending perpendicular to and intersecting respective conductors in said second array at respective matrix interconnection locations;

(b) defining along each of said axes a respective access channel extending through said surfaces and through holes in said conductors;

(c) storing a plurality of elongate jumper pins at plural storage locations on said first structure;

(d) in response to a connection command identifying a first conductor in said first array and originating at a location remote from said structure, automatically selecting one of said storage locations from which to remove one of said jumper pins;

(e) automatically moving a carriage in a transverse plane parallel to and spaced from said first surface to a location opposite the storage location selected in step (d);

(f) in response to said carriage attaining said opposite location in step (e), automatically projecting a pin picker from said carriage toward said first structure and positively engaging the jumper pin at said selected storage location;

(g) in response to completion of step (f), sensing whether or not a jumper pin is engaged by said pin picker;

(h) in response to sensing that the jumper pin is engaged in step (g), retracting said pin picker toward said carriage to remove the engaged jumper pin from the selected storage location, and then moving the carriage in said transverse plane to an insertion location wherein the engaged jumper pin is aligned with one of said access channels intersecting said first conductor; and (i) in response to said carriage attaining said insertion location, projecting said pin picker from said carriage to insert said jumper pin into said one access channel to establish an electrical connection between said first and second conductors.

17. The method of claim 16 further comprising the steps of:

(j) in response to step (i), sensing full insertion of said jumper pin into said one access channel;

(k) in response to step (j), releasing and forcefully ejecting the jumper pin from said pin picker; and (l) in response to step (k), retracting said pin picker toward said carriage.

18. The method of claim 17 wherein said jumper pins include a gripping portion having an annular recess, wherein step (f) includes radially projecting an element from said pin picker into said recess to positively engage said jumper pin, and wherein step (k) includes removing said element from said recess to release said jumper pin from the pin picker.

19. The method of claim 17 wherein said access channels are positioned at regularly spaced locations along said first structure, and wherein steps (e) and (h) include moving said carriage in said transverse plane in successive discrete steps, each discrete step corresponding to the spacing between successive access channels.

20. The method of claim 17 wherein said connection command originates at a microprocessor located at a facility geographically remote from said first structure.

21. The method of claim 17 wherein said first structure comprises first and second circuit boards and a first insulative board sandwiched therebetween, and wherein step (a) comprises the steps of:

(a.1) disposing each of said conductors of said first array as a pair of juxtaposed conductive traces on opposite surfaces of said first circuit board, and conductively joining said juxtaposed first array traces through the access channel passing therethrough;

(a.2) disposing each of said conductors of said second array as a pair of juxtaposed conductive traces on opposite surfaces of said second circuit board, and conductively joining said juxtaposed second array traces through the access channel passing therethrough; and (a.3) providing multiple through holes in said first insulative board in alignment with and constituting part of respective access channels.

22. The method of claim 21 wherein step (a) comprises disposing the conductors of said first array in orthogonal relation to the conductors in said second array.

23. The method of claim 22 wherein said first structure further comprises third and fourth circuit boards having a second insulative board sandwiched therebetween, and a third insulative board sandwiched between said second and third circuit boards, said method further comprising the steps of:

(m) disposing a third array of conductors as respective pairs of juxtaposed conductive traces on opposite surfaces of one of said third and fourth circuit boards, the conductors in said third array being arranged parallel to and juxtaposed with respective conductors in said first array, and conductively joining the juxtaposed third array traces via multiple holes defined through said third circuit board in alignment with and constituting part of respective access channels;

(n) disposing a fourth array of conductors as respective pairs of juxtaposed conductive traces on opposite surfaces of the other of said third and fourth circuit boards, the conductors in said fourth array being arranged parallel to and juxtaposed with respective conductors in said first array, and conductively joining the juxtaposed fourth array traces via multiple holes defined through said fourth circuit board in alignment with and constituting part of respective access channels; and (o) providing multiple through holes in said second and third insulative boards in alignment with and constituting part of respective access channels;

wherein step (i) includes additionally establishing electrical connection between conductors in said third and fourth arrays each time a jumper pin is inserted into an access channel to establish a connection between said first and second conductors.

24. The method of claim 23 wherein said jumper pins are inserted into and removed from said access channels from a first side of said first structure, said method further comprising the step of:

(p) providing conductive wire connections between said conductors and equipment external to said first structure from a second side of said first structure opposite said first side.

25. The method of claim 24 wherein step (p) includes the steps of:

(p.1) defining multiple connector channels through said first structure, each connector channel being formed by aligned holes defined through each of said circuit boards and said insulative boards;

(p.2) extending conductors in each of said arrays on each circuit board to respective connector channels passing through said each circuit board;

(p.3) connecting electrical wiring for external equipment to the circuit board at said second side of said first structure; and (p.4) inserting electrically conductive connector rods through selected connector channels to electrically interconnect said wiring with conductors in the arrays on different circuit boards.

26. The method of claim 25 further comprising the steps of:

(q) providing a second structure substantially identical to said first structure and including a matrix of substantially the same configuration as the matrix in said first structure with substantially identical first, second, third and fourth conductor arrays; and (r) selectively connecting a conductor in an array of the matrix on said first structure to a conductor in a different array on said second structure via one of said connector channels and one of said connector rods.

27. The method of claim 23 further comprising the steps of:

defining multiple additional holes through said structure along the periphery of said matrix and extending axially parallel to said access channels;

utilizing some of said additional holes as said storage locations for unused jumper pins; and utilizing others of said additional holes to provide interconnections between conductors in different arrays of said matrix.

28. The method of claim 27 further comprising the step of:

utilizing still others of said additional holes to provide connections between conductors in said arrays of said first structure to conductors in arrays of a separate structure having another matrix therein.

29. The method of claim 23 further comprising the steps of:

arranging said access channels in a matrix of columns and rows of access channels;

subdividing said matrix into a plurality of electrically unconnected access channel sub-matrices wherein conductors intersecting access channels in each sub-matrix are co-planar and co-linear with but electrically isolated from respective conductors intersecting access channels in another sub-matrix.

30. The method of claim 17 further comprising the steps of:

disposing third and fourth arrays of conductors on respective third and fourth spaced parallel surfaces of said first structure such that each conductor in said third array is parallel to and juxtaposed with a respective conductor in said first array; and extending said access channels along said axes to extend through holes in said conductors in said third and fourth arrays;

wherein step (i) includes additionally establishing electrical connection between conductors in said third and fourth arrays each time a jumper pin is inserted into an access channel to establish an electrical connection between said first and second conductors.

31. The method of claim 30 wherein said jumper pins are inserted into and removed from said access channels from a first side of said first structure, said method further comprising the step of:

(p) providing conductive wire connections between said conductors and equipment external to said first structure from a second side of said first structure opposite said first side.

32. The method of claim 31 wherein step (p) includes the steps of:

(p.1) defining multiple connector channels through said first structure, each connector channel being formed by aligned holes defined through each of said circuit boards and said insulative boards;

(p.2) extending conductors in each of said arrays on each circuit board to respective connector channels passing through said each circuit board;

(p.3) connecting electrical wiring for external equipment to the circuit board at said second side of said first structure; and (p.4) inserting electrically conductive connector rods through selected connector channels to electrically interconnect said wiring with conductors in the arrays on different circuit boards.

33. The method of claim 32 further comprising the steps of:

(q) providing a second structure substantially identical to said first structure and including a matrix of substantially the same configuration as the matrix in said first structure with substantially identical first, second, third and fourth conductor arrays; and (r) selectively connecting a conductor in an array of the matrix on said first structure to a conductor in a different array on said second structure via one of said connector channels and one of said connector rods.

34. The method of claim 30 further comprising the steps of:

defining multiple additional holes through said structure along the periphery of said matrix and extending axially parallel to said access channels;

utilizing some of said additional holes as said storage locations for unused jumper pins; and utilizing others of said additional holes to provide interconnections between conductors in different arrays of said matrix.

35. The method of claim 34 further comprising the step of:

utilizing still others of said additional holes to provide connections between conductors in said arrays of said first structure to conductors in arrays of a separate structure having another matrix therein.

36. The method of claim 30 further comprising the steps of:

arranging said access channels in a matrix of columns and rows of access channels;

subdividing said matrix into a plurality of electrically unconnected access channel sub-matrices wherein conductors intersecting access channels in each sub-matrix are co-planar and co-linear with but electrically isolated from respective conductors intersecting access channels in another sub-matrix.

37. A method for permitting selective interconnection between conductors on first and second circuit boards sandwiching an insulative board therebetween, said method comprising the steps of:

(a) defining multiple holes through all of said boards in a matrix of columns and rows to define access channels;

(b) disposing a first array of conductors on said first circuit board such that each conductor comprises a pair of juxtaposed conductive traces on opposite surfaces of said first circuit board, and interconnecting the juxtaposed traces in said first array through said access channels, each pair of juxtaposed traces in said first array extending along a respective row of said holes to thereby be intersected by multiple access channels;

(c) disposing a second array of conductors on said second circuit board such that each conductor in said second array comprises a pair of juxtaposed conductive traces on opposite surfaces of said second circuit board, and interconnecting the juxtaposed traces in said second array through said access channels, each pair of juxtaposed traces in said second array extending along a respective column of said holes to thereby be intersected by multiple access channels; and (d) selectively interconnecting an individual conductor in said first array to an individual conductor in said second array by inserting a jumper pin through an access channel intersecting the traces constituting said individual conductors.

38. The method of claim 37 wherein step (c) includes disposing said second array of conductors orthogonally with respect to said first array of conductors.

39. The method of claim 38 wherein third and fourth circuit boards are provided with a second insulative board sandwiched therebetween, and a third insulative board is sandwiched between said second and third circuit boards, said method further comprising the steps of:

(e) disposing a third array of conductors as respective pairs of juxtaposed conductive traces on opposite surfaces of one of said third and fourth circuit boards, the conductors in said third array being arranged parallel to and juxtaposed with respective conductors in said first array, and conductively joining the juxtaposed third array traces via multiple holes defined through said third circuit board in alignment with and constituting part of respective access channels;

(f) disposing a fourth array of conductors as respective pairs of juxtaposed conductive traces on opposite surfaces of the other of said third and fourth circuit boards, the conductors in said fourth array being arranged parallel to and juxtaposed with respective conductors in said first array, and conductively joining the juxtaposed fourth array traces via multiple holes defined through said fourth circuit board in alignment with and constituting part of respective access channels; and (g) providing multiple through holes in said second and third insulative boards in alignment with and constituting part of respective access channels;

wherein step (d) includes additionally interconnecting conductors in said third and fourth arrays each time a jumper pin is inserted into an access channel to establish a connection between said first and second arrays.

40. The method of claim 39 wherein said jumper pins are inserted into and removed from said access channels from a first side of said first boards, said method further comprising the step of:

(h) providing conductive wire connections between said conductors and equipment external to said boards from a second side of said boards opposite said first side.

41. The method of claim 40 wherein step (h) includes the steps of:

(h.1) defining multiple connector channels through said boards, each connector channel being formed by aligned holes defined through each of said circuit boards and said insulative boards;

(h.2) extending conductors in each of said arrays on each circuit board to respective connector channels passing through said each circuit board;

(h.3) connecting electrical wiring for external equipment to the circuit board at said second side of said boards; and (h.4) inserting electrically conductive connector rods through selected connector channels to electrically interconnect said wiring with conductors in the arrays on different circuit boards.

42. The method of claim 39 further comprising the step of:

subdividing said matrix into a plurality of electrically unconnected access channel sub-matrices wherein conductors intersecting access channels in each sub-matrix are co-planar and co-linear with but electrically isolated from respective conductors intersecting access channels in another sub-matrix.

43. The method of claim 39 further comprising the steps of:
   defining multiple additional holes through said structure along the periphery of said matrix and extending axially parallel to said access channels;
   utilizing some of said additional holes as said storage locations for unused jumper pins; and
   utilizing others of said additional holes to provide interconnections between conductors in different arrays of said matrix.

44. The method of claim 43 further comprising the step of:
   utilizing still others of said additional holes to provide connections between conductors in said arrays of said first structure to conductors in arrays of a separate structure having another matrix therein, 45. The method of claim 37 further comprising the step of:
   subdividing said matrix into a plurality of electrically unconnected access channel sub-matrices wherein conductors intersecting access channels in each sub-matrix are co-planar and co-linear with but electrically isolated from respective conductors intersecting access channels in another sub-matrix, 46. The system of claim 1 further comprising a plurality of additional holes, each additional hole extending through all of said circuit boards and disposed along the periphery of said matrix, wherein some of said additional holes are electrically unconnected to any of said conductors in said arrays and constitute means for storing unused jumper pins, and wherein others of said additional holes are electrically connected to conductors in at least two of said arrays and constitute means for providing a connection path between those conductors.

47. The system of claim 46 wherein still others of said additional holes are electrically connected to conductors in at least one of said arrays and constitute means for providing a connection path between said matrix and a separately substantially identical matrix.

48. The system of claim 1 wherein said matrix is sub-divided into a plurality of sub-matrices including at least first and second sub-matrices wherein the conductors in each array comprise at least first and second unconnected co-linear segments disposed in separate sub-matrices, the sub-matrices being separated by planes extending perpendicularly through said circuit boards.

49. The system of claim 11 further comprising a plurality of additional holes, each additional hole extending through all of said circuit boards and disposed along the periphery of said matrix, wherein some of said additional holes are electrically unconnected to any of said conductors in said arrays and constitute means for storing unused jumper pins, and wherein others of said additional holes are electrically connected to conductors in at least two of said arrays and constitute means for providing a connection path between those conductors.

50. The system of claim 49 wherein still others of said additional holes are electrically connected to conductors in at least one of said arrays and constitute means for providing a connection path between said matrix and a separately substantially identical matrix.

51. The system of claim 50 wherein said matrix is sub-divided into a plurality of sub-matrices including at least first and second sub-matrices wherein the conductors in each array comprise at least first and second unconnected co-linear segments disposed in separate sub-matrices, the sub-matrices being separated by planes extending perpendicularly through said circuit boards.

52. The system of claim 4 wherein each of said arrays is sub-divided into at least first and second electrically unconnected sub-arrays in which the conductors in said first sub-array are co-planar, wherein each conductor in the first sub-array is electrically isolated from but co-linearly aligned with a respective conductor in the second sub-array, wherein the first sub-array on each of said circuit boards is aligned in juxtaposition with the first sub-array on each of the other circuit boards, wherein the second sub-array on each of said circuit boards is aligned in juxtaposition with the second sub-array on each of the other circuit boards, and wherein the aligned first sub-arrays and aligned second sub-arrays define respective first and second electrically isolated sub-matrices.

53. The system of claim 52 wherein said first and second sub-matrices are separated along a plane extending perpendicular to said arrays and diagonally to said conductors.

54. The system of claim 11 wherein each of said arrays is sub-divided into at least first and second electrically unconnected sub-arrays in which the conductors in said first sub-array are co-planar, wherein each conductor in the first sub-array is electrically isolated from but co-linearly aligned with a respective conductor in the second sub-array, wherein the first sub-array on said first circuit board is aligned in juxtaposition with the first sub-array on the second circuit board, wherein the second sub-array on said first circuit board is aligned in juxtaposition with the second sub-array on the second circuit board, and wherein the aligned first sub-arrays and aligned second sub-arrays define respective first and second electrically isolated sub-matrices.

55. The system of claim 54 wherein said first and second sub-matrices are separated along a plane extending perpendicular to said arrays and diagonally to said conductors.

56. An interconnection matrix system comprising:
   a first circuit board having a first surface with a first array of multiple electrical conductors thereon, said first circuit board having multiple matrix holes defined therethrough and through said electrical conductors at predetermined locations along said conductors in said first array;
   a second circuit board having a first surface with a second array of multiple electrical conductors thereon, said second circuit board having multiple matrix holes defined therethrough and through said electrical conductors in said second array at predetermined locations along said conductors in said second array, wherein the matrix holes in said first circuit board are concentrically aligned with corresponding matrix holes in said second circuit board;
   wherein each of said arrays is sub-divided into at least first and second electrically unconnected sub-arrays in which the conductors in said first sub-array are co-planar, wherein each conductor in the first sub-array is electrically isolated from but co-linearly aligned with a respective conductor in the second sub-array, wherein the first sub-array on the first circuit board is aligned in juxtaposition with the first sub-array on the second circuit board, wherein the second sub-array on said first circuit board is aligned in juxtaposition with the second sub-array on the second circuit board, and wherein the aligned first sub-arrays and aligned second sub-arrays define respective first and second electrically isolated sub-matrices;
   wherein said first and second sub-matrices are separated along a plane extending perpendicular to both of said arrays of and diagonally to said conductors.

* * * * *